United States Patent [19]

Grabbe

[11] 4,408,218
[45] Oct. 4, 1983

[54] CERAMIC CHIP CARRIER WITH LEAD FRAME HAVING REMOVABLE RIM

[75] Inventor: Dimitry G. Grabbe, Lisbon Falls, Me.

[73] Assignee: AMP Incorporated, Harrisburg, Pa.

[21] Appl. No.: 248,605

[22] Filed: Mar. 27, 1981

[51] Int. Cl.³ ............................................. H01L 23/48
[52] U.S. Cl. ........................................ 357/70; 357/80; 174/52 FP
[58] Field of Search ................... 228/180 A, 6 R, 160; 29/827; 357/70; 361/421; 174/52 FP

[56] References Cited

U.S. PATENT DOCUMENTS

| | | | |
|---|---|---|---|
| 3,611,061 | 10/1971 | Segerson | 317/234 |
| 3,711,625 | 1/1973 | Dupuis | 174/52 PE |
| 3,882,597 | 5/1975 | Chayka et al. | 29/827 |
| 4,012,766 | 3/1977 | Phillips et al. | 357/70 |
| 4,048,438 | 9/1977 | Zimmerman | 174/68.5 |
| 4,049,903 | 9/1977 | Kobler | 174/68.5 |
| 4,089,733 | 5/1978 | Zimmerman | 156/630 |
| 4,129,243 | 12/1978 | Cusano et al. | 228/122 |
| 4,137,546 | 1/1979 | Frusco | 357/70 |
| 4,141,712 | 2/1979 | Rogers | 29/827 |
| 4,204,317 | 5/1980 | Winn | 29/827 |
| 4,289,922 | 9/1981 | Devlin | 174/52 FP |
| 4,362,902 | 12/1982 | Grabbe | 357/70 |
| 4,380,042 | 4/1983 | Angelucci et al. | 361/421 |

FOREIGN PATENT DOCUMENTS 2027990 2/1980 United Kingdom ................. 357/70

Primary Examiner—Nicholas P. Godici
Assistant Examiner—M. Jordan
Attorney, Agent, or Firm—F. Brice Faller

[57] ABSTRACT

A ceramic chip carrier having a copper lead frame bonded directly to a ceramic substrate has a common rim connecting the tip portions of the leads. The rim is provided with extended portions which permit bending the rim away from the substrate without altering the relative positions of the tip portions. The rim is thus raised above the center region of the substrate and does not bond to the substrate and is thus readily removed after bonding the lead frame to the substrate.

2 Claims, 4 Drawing Figures

CERAMIC CHIP CARRIER WITH LEAD FRAME HAVING REMOVABLE RIM

BACKGROUND OF THE INVENTION

1. Field of the Invention

This invention relates to a process for accurately positioning a lead frame onto a ceramic chip carrier to permit wire bonding to the lead frame by means of automatic wire bonding machinery.

2. Description of the Prior Art

In the formation of ceramic chip carriers, lead frames are normally bonded to the ceramic substrate with subsequent connections being made to the leads of the lead frame from appropriate pads on semiconductor chips secured to the ceramic substrate. These connections from the pads on the chip to the leads of the lead frame are made manually or by means of automatic wire bonding machinery or by mass-bonding techniques using "spider" tape. The automatic wire bonding machinery is normally computer operated on an x-y coordinate basis and it is therefore necessary that the leads of the lead frame be accurately positioned on the substrate so that wiring which is run from pads on the semiconductor chip to the appropriate lead on the lead frame is in fact bonded to the appropriate lead on the lead frame.

In accordance with some of the prior art, the entire lead frame was bonded to the ceramic substrate by well known methods and the portions of the leads closely adjacent to the semiconductor device to which wire bonding was to take place would move relative to the semiconductor pads during the process of bonding the lead frame to the ceramic substrate. It is therefore readily apparent that automatic wire bonding machines can not be used with the types of prior art combinations of substrate and lead frame because bonding from appropriate pads of the semiconductor devices to the appropriate leads of the lead frame can not be definitely predicted. It is therefore necessary that a lead frame be bonded to a ceramic substrate wherein the leads of the lead frame are accurately positioned on the substrate and maintain their position during and after the procedure of bonding the lead frame to the substrate.

SUMMARY OF THE INVENTION

In accordance with the present invention, there is provided a chip carrier having a lead frame wherein the ends of each of the inner lead portions, which are closely adjacent the semiconductor device to which the leads are to be bonded, are manufactured with the ends of the inner leads temporarily connected to a common supporting rim which must be removed after the attachment of the lead frame to the ceramic substrate is completed. This provides accurate and constant spacing between the leads of the lead frame during bonding of the lead frame to the ceramic substrate. However, in order to present movement of the entire lead set with the attached rim, it is necessary that additional material be provided which is capable of moving without providing forces on the leads themselves or the rim which might tend to move the leads from their initial position. It is also necessary that the tips of the leads closely adjacent the semiconductor device to which attachment is to be made be disposed above and out of contact with the ceramic substrate during bonding of the lead frame to the substrate so that bonding of the lead edges and rim will not take place, thereby allowing these edges with the rim to be easily removed later. The supporting rim design provides deformable portions thereof in regions away from the leads such that, during preforming of the rim upward from the substrate prior to lead frame attachment, a deformation of the specially provided portion of the rim permits increase in the length of the perimeter of such rim which occurs only in these designated places and is not uniformly distributed around the perimeter. This deformation takes place at regions at the four corners wherein the rim portion is extending in a somewhat elliptical or other manner. After firing and bonding of the lead frame to the substrate, the unbonded temporary support rim including the associated deformable portion are removed by pinch cutting, etching or the like.

DESCRIPTION OF THE PREFERRED EMBODIMENT

Figure 1:
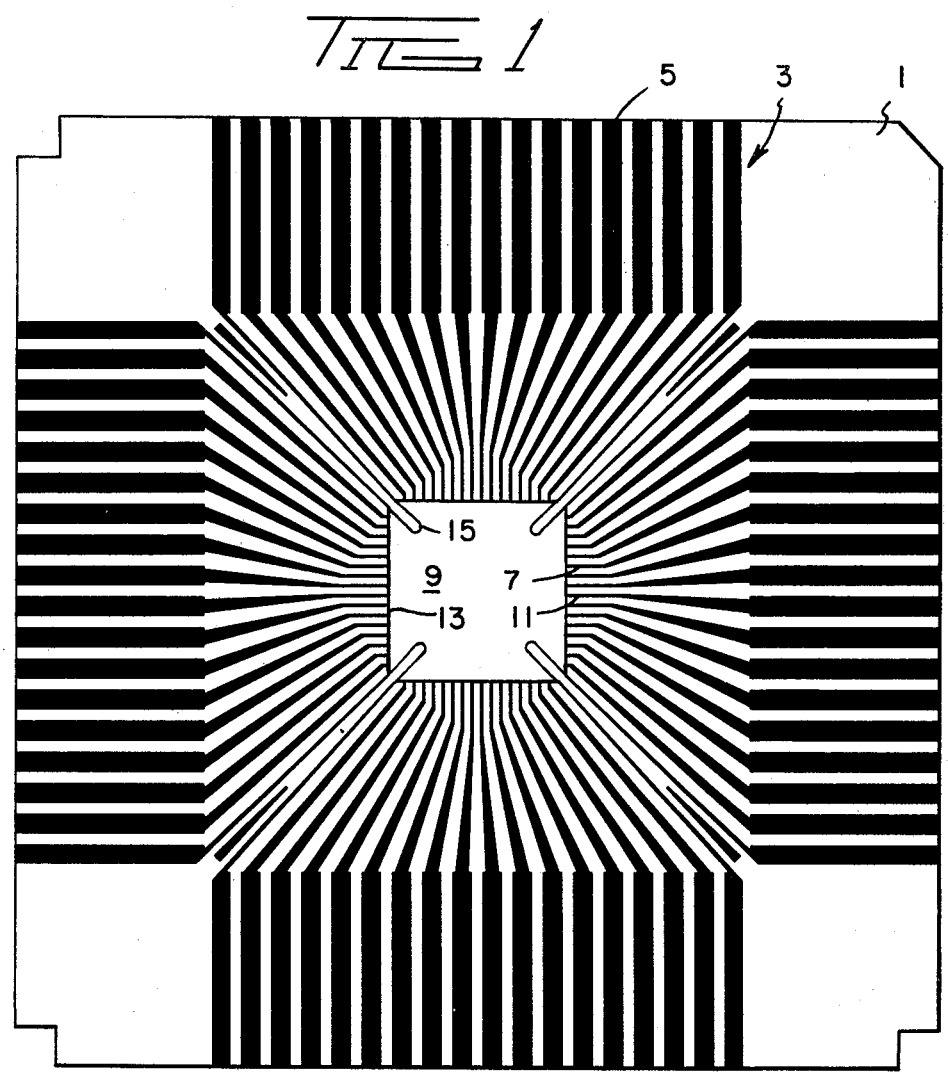
FIG. 1 is a top view of the semiconductor chip carrier including a ceramic substrate having a lead frame bonded thereto, the lead frame having a rim at the internal regions thereof.

Referring first to FIG. 1, there is shown a ceramic substrate 1 which is formed of alumina, beryllia, or other ceramic. Positioned on the substrate 1 is a lead frame 3 composed of a plurality of leads having regions 5 which travel to the edge of the substrate 1 and have narrowed regions 7 to which bonding will take place with wires which are also bonded to semiconductor chips which are placed in the interior region 9 and bonded to the substrate 1 in known manner. The lead frame 5 is preferably formed of copper or copper surfaced metal and is bonded to the ceramic substrate by the procedures set forth in the patents of Burgess et al (U.S. Pat. No. 3,744,120), Babcock et al (U.S. Pat. No. 3,766,634), Burgess et al (U.S. Pat. No. (3,854,892), Burgess et al (U.S. Pat. No. 3,911,553), Cusano et al (U.S. Pat. No. (3,994,430) and Cusano et al (U.S. Pat. No. 4,129,243).

The processes involve bonding a metallic member to a non-metallic substrate by means of a bonding agent in the form of a eutectic composition at the interface. The preferred materials in the context of the present invention are a copper lead frame and a ceramic substrate of alumina or beyllia, the bonding agent therefor being copper oxide according to the teachings of the above patents. The copper oxide may be formed on the lead frame 3 most conveniently by heating the entire lead frame 3 in a reactive atmosphere containing oxygen, or by applying particulate copper oxide in an appropriate vehicle to one of the interface surfaces. The lead frame is placed in contact with the ceramic and heated to just below the melting point of the copper, which forms a copper-copper oxide eutectic melt at the interface which wets both the lead frame and the substrate. Upon cooling, the melt bonds the copper to the substrate. The amount of eutectic composition is so small that, for thermal and electrical purposes, the bond behaves essentially as if it were metal and ceramic. The term "direct bond" will thus be understood to mean a bond achieved according to the teachings of the above-cited patents.

In order to accurately position the thin tips of the lead 7 on the substrate 1 so that automatic wire bonding techniques can accurately be used for bonding wires from the semiconductor pads (not shown) to the leads 7, the interior edges of the leads 7 are raised above the substrate 1 so that they are not in contact with the substrate during the procedure of bonding the lead frame 3 to the substrate 1. This raised configuration is shown as 11 in FIG. 2 wherein it can be seen that the tip 11 of the lead 7 is not in contact with the substrate 1. In order to prevent movement of the leads 7 during the bonding procedure, a rim 13 is provided which is secured to all of the tips 11 of the leads 7 and, in addition, an extended portion 15 of rim material away from the lead tips 11 is provided so that when the rim and tip portion are raised interior region 9 of ceramic substrate 1, as shown at 11 in FIG. 2, any movement caused by this raising action will take place substantially only in the extended portions 15, thereby retaining the accurate positioning of the leads 7 with respect to the substrate 1.

Figure 2:
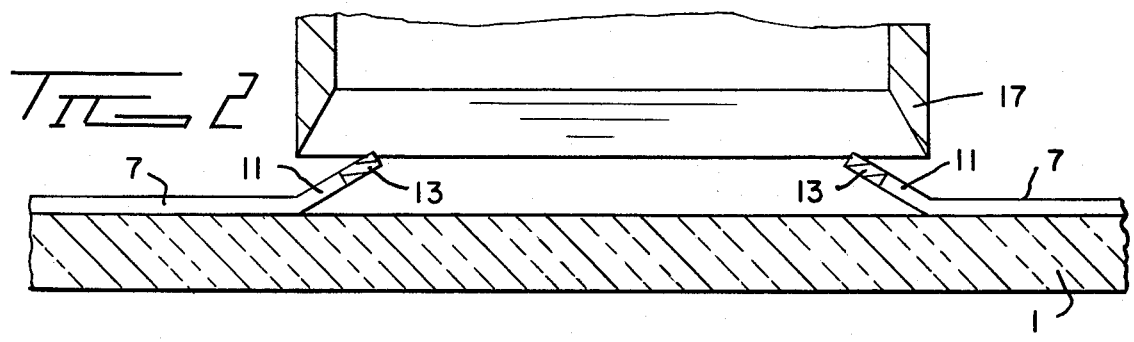
FIG. 2 is a cross-section of the chip carrier of FIG. 1 with a cutting element positioned thereabove.

After the firing takes place whereby the lead frame 3 bonds to the substrate 1 in accordance with the procedure set forth in the above noted patents, the leads 7 will bond to the substrate 1 in exactly the locations at which they were originally placed. The lead portions at the edges 11 including the rim portions 13 and 15 will be raised above the substrate 1 as shown in FIG. 2 and will not have bonded thereto since they will have been raised before the bonding procedure took place. At this point, the rim portions 13 and 15 will be removed by means of pinch cutting element 17 shown in FIG. 2 which will remove the rim portions.

Figure 3:
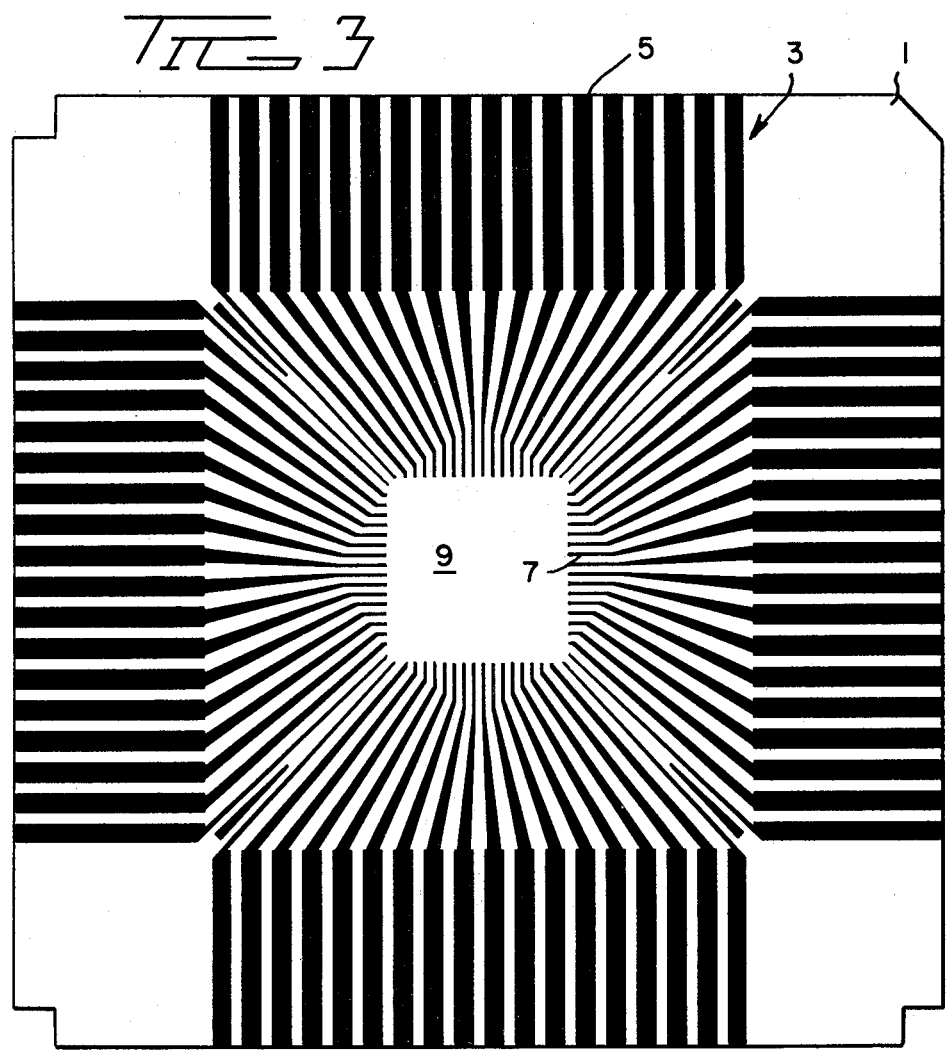
FIG. 3 is a view of the chip carrier of FIG. 1 after the rim has been removed.
Figure 4:
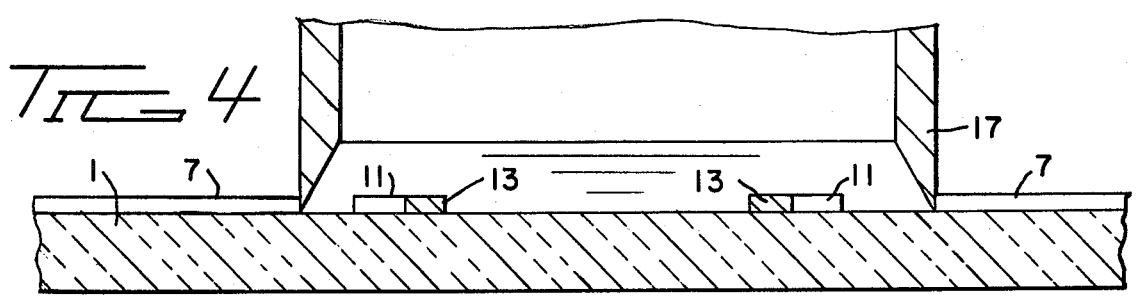
FIG. 4 is a cross-section of the chip carrier of FIG. 3 with a cutting element positioned thereon.

Referring now to FIG. 3, there is shown the chip carrier after the rim has been removed. It can be seen that the edges of all of the leads 7 are properly positioned and available for bonding of wires thereto by automatic wire bonding machinery. FIG. 4 shows a cross-section through FIG. 3 after the rim has been removed.

It can be seen that there has been provided a method where lead frames can be positioned on ceramic substrates with the leads of the lead frame retaining their position relative to the substrate without movement during the bonding operation.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A semiconductor chip carrier of the type comprising a ceramic substrate with a metallic lead frame attached thereto, said lead frame comprising a plurality of leads having outer portions which extend to the edge of said substrate and tip portions proximate to the interior region of said substrate, said tip portions having integral support means attached thereto, characterized in that said lead frame is bonded directly to said substrate, said support means comprising a common rim overlying said interior region of said substrate and spaced therefrom, said rim having extended portions which connect adjacent tip portions which are substantially non-parallel, said extended portions having a length greater than the shortest straight line distance between said adjacent non-parallel tip portions, said rim being bent to a non-coplanar relationship to the rest of said lead frame.

2. The chip carrier of claim 1 characterized in that said interior region is coplanar with the surface of the substrate to which the lead frame is bonded.

* * * * *